United States Patent [19]

Kajimura et al.

[11] Patent Number: 5,136,601
[45] Date of Patent: Aug. 4, 1992

[54] SEMICONDUCTOR LASER

[75] Inventors: Takashi Kajimura, Nishitama; Naoki Chinone, Hachioji; Yuichi Ono, Nishitama; Shinichi Nakatsuka; Kazuhisa Uomi, both of Kokubunji; Toshihiro Kawano, Hachioji; Tsukuru Ohtoshi, Kokubunji; Yasutoshi Kashiwada, Nishitama, all of Japan

[73] Assignee: Hitachi, Ltd., Tokyo, Japan

[21] Appl. No.: 379,672

[22] Filed: Jul. 13, 1989

Related U.S. Application Data

[63] Continuation of Ser. No. 799,019, Nov. 18, 1985, abandoned.

[30] Foreign Application Priority Data

Nov. 19, 1984 [JP] Japan .................. 59-242297
Jan. 25, 1985 [JP] Japan .................. 60-10849

[51] Int. Cl.$^5$ ............................. H01S 3/19
[52] U.S. Cl. ........................... 372/44; 372/45; 372/46; 372/48
[58] Field of Search .................. 372/44, 45, 46, 48

[56] References Cited

U.S. PATENT DOCUMENTS

| | | |
|---|---|---|
| 4,360,919 | 11/1982 | Fujiwara et al. .......... 372/48 |
| 4,404,678 | 9/1983 | Aiki et al. ............... 372/45 |
| 4,594,718 | 6/1986 | Scifres et al. ............ 372/45 |
| 4,606,033 | 8/1986 | Sakamoto ................. 372/45 |
| 4,674,094 | 6/1987 | Murakami ................. 372/45 |
| 4,682,337 | 7/1987 | Amann .................... 372/44 |
| 4,691,321 | 9/1987 | Motegi et al. ............ 372/45 |
| 4,694,459 | 9/1987 | Burnham et al. .......... 372/45 |

FOREIGN PATENT DOCUMENTS

| | | |
|---|---|---|
| 0115390 | 8/1984 | European Pat. Off. ........ 372/45 |
| 58-115877 | 7/1983 | Japan ..................... 372/48 |
| 58111373 | 1/1985 | Japan ..................... 372/46 |

OTHER PUBLICATIONS

J. J. Coleman and P.D. Dapkus, Single-Longitudinal-Mode Metalorganic Chemical-Vapor-Deposition Self-Aligned GaAlAs-GaAs Double-Heterostructure Lasers, Aug. 1, 1980, pp. 262-263.
29p-M-4, Assoc. of the Applied Physics, 1984, pp. 172.
Appl. Phys. Lett. 40(4), Mar. 1, 1982, pp. 372-374.
Copy of English translation of 29p-M-4.

*Primary Examiner*—Eugene R. LaRoche
*Assistant Examiner*—Michael B. Shingleton
*Attorney, Agent, or Firm*—Antonelli, Terry Stout & Kraus

[57] ABSTRACT

A semiconductor laser having a stripe-like lasing region, wherein the structure of the lasing region such as the mechanism of optical guiding of the lateral mode control structure is made different between the central portion in the lasing region and portions close to facets, in order to reduce optical feedback induced noise and astigmatism, and to facilitate the manufacture thereof.

3 Claims, 4 Drawing Sheets

SEMICONDUCTOR LASER

This application is a continuation of application Ser. No. 06/799,019, filed Nov. 18, 1985 now abandoned.

BACKGROUND OF THE INVENTION

The present invention relates to the structure of a semiconductor laser. In particular, the invention relates to the structure of a low-noise semiconductor laser having no astigmatism which is suited for a light source for devices for consumer electronics such as compact disk and optical video disc, for optical information processing systems and for optical communications.

In using a semiconductor laser as a light source for devices for consumer electronics such as optical video discs and compact discs, and for optical information processing systems, the light reflected by the optical system in these devices returns to the semiconductor laser, which is the light source, giving rise to the occurrence of such a phenomenon that noise increases in the semiconductor laser. In order to reduce the above optical feedback induced noise, the semiconductor laser must be self-pulsated or the oscillating spectrum must be multiplied. However, the self-pulsating or the spectrum-multiplied (multi-longitudinal-mode operation) laser induces astigmatism which must be corrected by employing a cylindrical lens when the laser is to be adapted to the devices. Such lasers have been taught, for example, in the preparatory document for the Thirty-First Association of the Applied Physics, p. 177, 30a-M-6 and 30a-M-8 and in the preparatory document for the Forty-Fourth Association of the Applied Physics, p. 110, 27a-p-3. However, the former laser does not self-pulsate, and the latter laser induces astigmatism though it self-pulsates.

FIG. 1 shows a conventional semiconductor laser obtained by the metal organic chemical vapor deposition (MOCVD) method.

The semiconductor laser of this structure has been disclosed in J. J. Coleman et al., Applied Physics Letters, Vol. 37, 1980, p. 262. This laser is so constructed that a striped n-type injection current confinement layer 5 is formed on cladding layers 2, 4 between which an active layer 3 is placed, and the injection current confinement layer 5 is buried under a cladding layer 6 and a cap layer 7 to control the lateral mode. Reference numerals 8 and 9 denote a p-type electrode and an n-type electrode respectively. With the semiconductor laser of this structure, the mode control is of the type of index-guiding, and the longitudinal mode is a single mode. Therefore, the level of relative intensity noise (RIN) is about $10^{-12} H_z^{-1}$ (when the light is fed back from the optical system), and the noise must be reduced by adopting a high-frequency superposition system or a like system.

SUMMARY OF THE INVENTION

The object of the present invention is to provide a semiconductor laser which has no astigmatism, which features low noise, and which can be produced maintaining a high yield.

To produce a semiconductor laser without astigmatism, the mechanism of guiding laser beam must be of the index-guiding type. In this case, however, the oscillating spectrum is single and optical feedback induced noise appears. When the mechanism of guiding in the form of gain-guiding or in the form of self-pulsating construction is used to avoid optical feedback induced noise, then astigmatism develops. In view of the abovementioned respects, according to the present invention, at least the optical guiding close to one facet of the semiconductor laser is formed as an index-guiding, and another region is formed as a gain-guiding or in the self-pulsating construction, so that a laser beam of low noise is obtained from at least one facet without astigmatism. For this purpose, the semiconductor laser of the present invention is provided with a stripe-like injection current confinement structure on a double heterostructure having a flat active layer so as to be adapted to the metal organic chemical vapor deposition method (MOCVD method), which is a new method of growing crystal and which is suited for mass-production; and wherein the thickness of the cladding layer on the active layer is changed, and a layer of a material having a large refractive index is provided on the cladding layer, so that the effective refractive index of the active layer corresponding to the injection current confinement structure changes in the direction of the cavity. Thus, there is obtained a semiconductor laser which performs index-guiding at least near one facet thereof, and which performs gain-guiding or undergoes self-pulsation in another region. Namely, the present invention deals with a semiconductor laser having a stripe-like lasing region, and having means for confining current injection in the lasing region, said means being provided close to said lasing region, wherein provision is made for means for changing the effective refractive index for the laser beam in the direction of the cavity, so that the laser beam is effectively index-guided in at least a portion close to one facet of the laser.

To reduce the noise caused by the light fed back to the semiconductor laser, furthermore, the laser-oscillated spectrum must be multiplied to reduce the susceptibility to interference in the laser beam. According to the present invention, a guiding region based upon the difference in the effective refractive index is provided near the facet of the semiconductor laser resonator, and a gain-guiding region is provided in the center of the resonator, so that the whole laser resonator produces a guiding condition that is somewhere in between index-guiding and gain-guiding, and so that the oscillating spectrum is multiplied to lower the noise. According to the present invention, components of the index-guiding and the gain-guiding are adjusted by adjusting the proportions of the respective areas in the whole resonator. Therefore, the laser element can be produced maintaining a high yield. Further, index-guiding is effected near the facet of the laser, and no astigmatism develops.

To realize the low-noise laser, furthermore, the oscillating spectrum should develop self-pulsation at a position between the multi-mode oscillation and the single-mode oscillation. For this purpose, it is essential to provide a new structure having a function of the gain-guiding type laser as well as a function of the index-guiding type laser. To produce the gain-guiding function, it can be contrived to provide a weakly supersaturated absorbing region outside the stripe region. In the conventional semiconductor laser shown in FIG. 1, however, the semiconductor layer which absorbs the light consists only of the n-GaAs injection current confinement layer 5 outside the grooved stripe region as shown in FIG. 2(a). However, the n-GaAs injection current confinement layer 5 has an absorption coefficient α of as great as 10,000 $cm^{-1}$ or more and cannot operate as a supersaturated absorbing member. Consequently, both the longitudinal and lateral modes are monotonous modes. According to the laser of the present invention, however, an n-GaAlAs supersaturated absorbing layer 310 is formed between the n-GaAs injection current confinement layer 35 and a p-GaAlAs cladding layer 34 outside the grooved stripe region as shown in FIG. 2(b). Therefore, the laser undergoes the self-pulsation. Here, what is important to develop self-pulsation is that the mole ratio of aluminum in the supersaturated absorbing layers 310 is set to be equal to or smaller than the mole ratio of aluminum in the active layer 33. Furthermore, an n-GaAlAs absorbed carrier leakage preventing layer 311 is provided between the supersaturated absorbing layer 310 and the injection current confinement layer 35 in order to prevent carriers generated as a result of absorbing light from leaking into the injection current confinement layer 35. Here, the mole ratio of aluminum in the absorbed leakage preventing layer 11 must be greater than the mole ratio of aluminum in the supersaturated absorbing layer 310. Further, if mole ratios of aluminum are suitable selected in the supersaturated absorbing layer 310 and in the absorbed carrier leakage preventing layer 311, the laser easily undergoes self-pulsation even if their thicknesses are reduced. If the thicknesses are set to be smaller than 100 nm, respectively, the distribution of light is affected by the presence of these two layers to a very small or negligible degree. Namely, thickness of the p-GaAlAs cladding layer 4 is suitably reduced (about 0.3 $\mu$m or less) to form an index-guiding path while eliminating the astigmatism, and the supersaturated absorbing layer 310 easily develops self-pulsation.

According to the present invention, a semiconductor laser of low noise having astigmatism of smaller than 3 $\mu$m can be easily obtained maintaining a high yield. In other words, the lasers can be mass-produced at a reduced cost.

BRIEF DESCRIPTION OF THE DRAWINGS

FIGS. 3(a) to 3(c) are diagrams showing a semiconductor laser according to an embodiment 1 of the present invention, wherein FIG. 3(a) is a plan view, FIG. 3(b) is a section view of a region close to one facet, and FIG. 3(c) is a section view of a region other than the above-mentioned facet;

FIGS. 4(a) to 4(c) are diagrams showing a semiconductor laser according to an embodiment 3 of the present invention, wherein FIG. 4(a) is a plan view, FIG. 4(b) is a section view of a region close to one facet, and FIG. 4(c) is a section view of a region other than the above-mentioned facet;

DETAILED DESCRIPTION OF THE PREFERRED EMBODIMENTS

Embodiment 1

Figure 1:
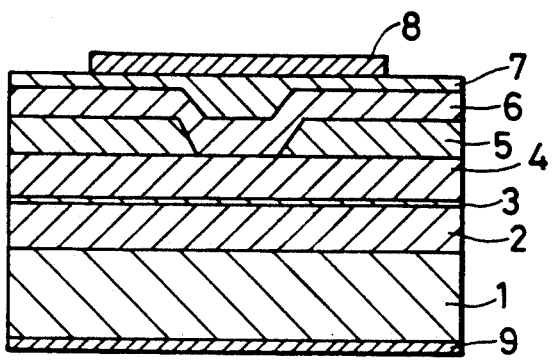
FIG. 1 is a section view of the structure of an element for explaining a conventional method.
Figure 2A:
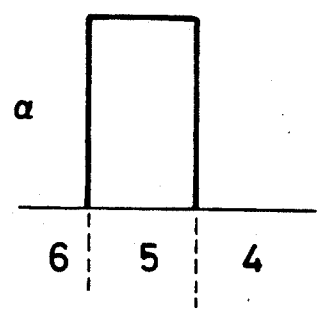
FIG. 2 is a diagram showing the distribution of absorption coefficient outside the grooved stripe region.
Figure 2B:
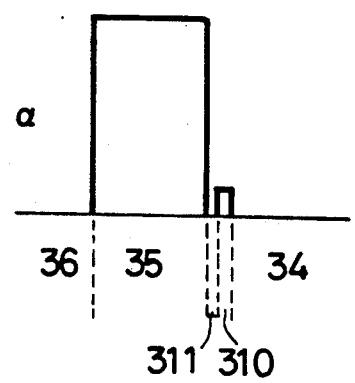
Figure 3A:
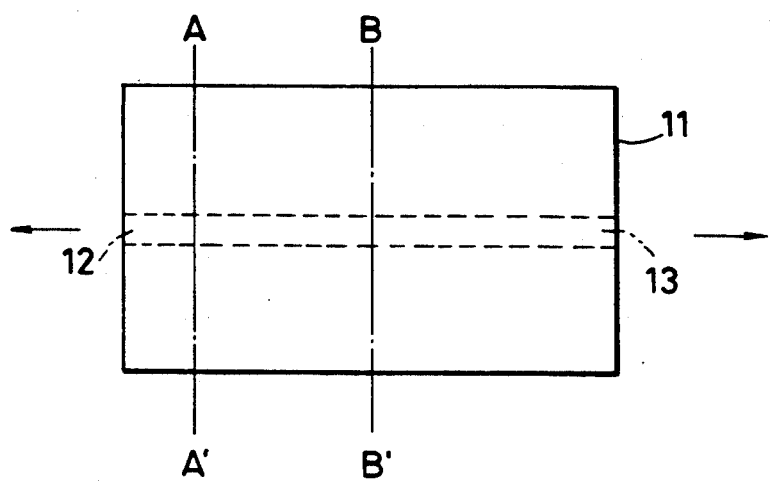
Figure 3B:
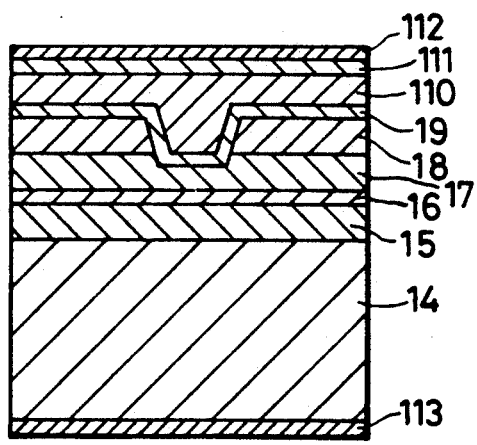
Figure 3C:
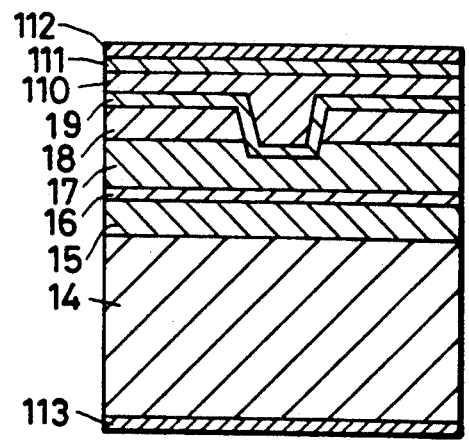

FIGS. 3(a) to 3(c) are diagrams showing a semiconductor laser according to an embodiment 1 of the present invention, wherein FIG. 3(a) is a plan view of a semiconductor laser, FIG. 3(b) is a section view of a region close to one facet according to the embodiment, and FIG. 3(c) is a section view of a region other than the above-mentioned facet according to the embodiment.

In FIG. 3(a), broken lines represent a stripe-like lasing region in a semiconductor laser 11. FIG. 3(b) is a section view along the line A—A' of FIG. 3(a), and shows the structure of a region 12 close to one facet of the semiconductor laser 11. FIG. 3(c) is a section view showing the structure along the line B—B' of FIG. 3(a). In FIGS. 3(b) and 3(c), an n-type $Ga_{1-x}Al_xAs$ cladding layer 15 (Se-doped; $n=5\times10^{17}$ cm$^{-3}$; x=0.45; thickness=1.5 $\mu$m), an undoped $Ga_{1-y}Al_yAs$ active layer 16 (y=0.14; thickness=0.06 to 0.08 $\mu$m), a p-type $Ga_{1-x}Al_xAs$ cladding layer 17 (Zn-doped; $p=3\times10^{17}$ cm$^{-3}$; thickness=1.0 $\mu$m), and an n-type GaAs layer 18 (Se-doped; n=3 to $5\times10^{18}$ cm$^{-3}$; thickness=1 $\mu$m) are continuously grown on an n-type GaAs substrate 14 i-doped; $n=10^{18}$ cm$^{-3}$) by the MOCVD method. Then, etching windows of a width of 20 to 100 $\mu$m are formed maintaining a distance of 300 $\mu$m in the $<0\overline{1}1>$ direction through the step of photoresist processing, and the n-type GaAs layer 18 is etched by about 0.5 $\mu$m by chemical etching. Channel grooves having a width of 2 to 5 $\mu$m and a depth of about 1.2 $\mu$m are formed maintaining a pitch of 400 $\mu$m in the $<01\overline{1}>$ direction through the steps of photoresist and etching. The crystal in which the grooves are etched is buried under a p-type $Ga_{1-z}Al_zAs$ layer 19 (Zn-doped; $p=3\times10^{17}$ cm$^{-3}$; z=0.35; thickness=0.5 $\mu$m), p-type $Ga_{1-x}Al_xAs$ layer 110 (Zn-doped; $p=5\times10^{17}$ cm$^{-3}$; thickness=1 $\mu$m), and p-type GaAs layer 111 (Zn-doped; $p=1\times10^{18}$ cm$^{-3}$; thickness=1 $\mu$m). After a p-type electrode 112 and an n-type electrode 113 are formed, a semiconductor laser having a resonator length of 300 $\mu$m is produced through the step of cleaving. The cleaving is positioned nearly at the center of the etched region formed in the $<0\overline{1}1>$ direction through the above-mentioned step.

In the above-mentioned semiconductor, the mechanism for controlling the lateral mode is changed by the thickness of the p-type $Ga_{1-x}Al_xAs$ layer 17 in the stripe region. When the thickness is small as shown in FIG. 3(b), the lateral mode is affected by the p-type $Ga_{1-z}Al_z$As layer 19 of a high refractive index, and is index-guided. When the p-type $Ga_{1-x}Al_xAs$ layer 17 has a large thickness as shown in FIG. 3(c), on the other hand, the index-guiding component decreases, and the gain-guiding component increases. The, device is so constructed that the gain-guiding region occupies at least more than one-half the stripe region. With this structure, the laser oscillation is determined by the structure of the region 13 which occupies most of the stripe region. According to this embodiment, the device undergoes multi-mode pulsation or self-pulsation. The astigmatism, however, becomes small, since the laser beam emitted from the facet of the side of the region 12 is subjected to the mode transformation through the region 12.

The semiconductor laser of the above-mentioned embodiment continuously operates at room temperature at a wavelength of 780 nm with a threshold current of 40 mA. Observation of the oscillating spectrum proves that the semiconductor laser is self-pulsating. With the semiconductor laser being operated to produce an optical output of 5 mW constant, the relative intensity of noise was measured by changing the temperature of the semiconductor laser, and it was confirmed that the noise was as small as $5 \times 10^{-14}$ or lower when the feedback intensity of light was smaller than 1%. The astigmatism of the semiconductor laser of the present invention was also measured to be smaller than 3 $\mu$m. Furthermore, a semiconductor laser having the region 12 of FIG. 3(a) was also prepared. This device exhibited the astigmatism of 10 to 30 $\mu$m.

Embodiment 2

This embodiment adopts a multi-quantum well structure for the $Ga_{1-y}Al_yAs$ active layer 16 of the above-mentioned embodiment 1. The multi-quantum well consists of a periodic structure which is made up of a GaAs well layer (thickness of 3 nm) 17 and a $Ga_{0.8}Al_{0.2}Al$ barrier layer (thickness of 5 nm) 16. The semiconductor laser produces a threshold current of about 25 mA at a wavelength of 780 $\mu$m. As for the lasing noise and astigmatism, the results are the same as those of the embodiment 1.

Embodiment 3

Figure 4A:
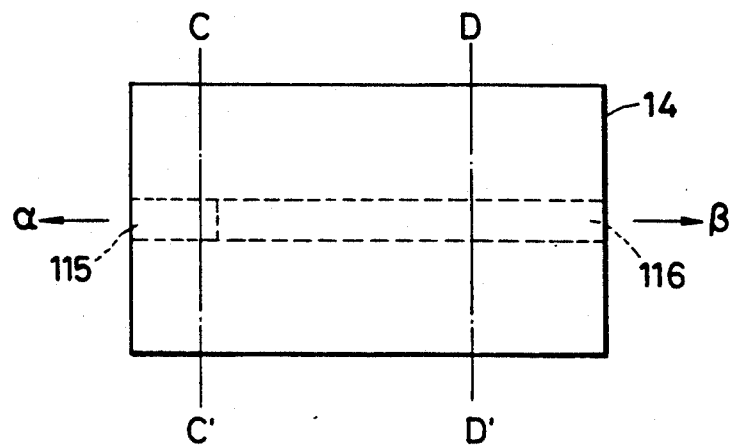
Figure 4B:
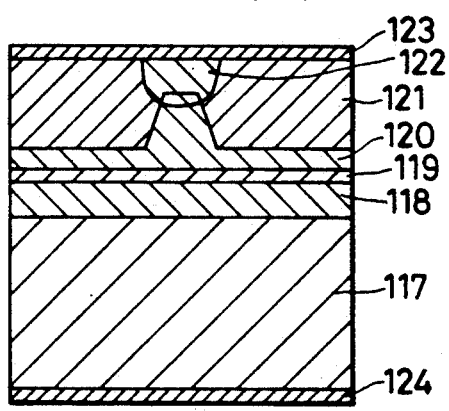
Figure 4C:
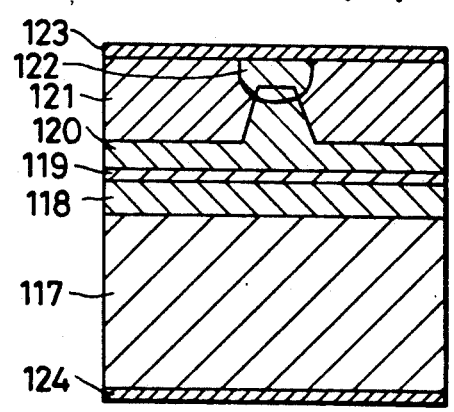

FIG. 4(a) is a plan view of this embodiment, wherein a stripe indicated by chain lines represents a lasing region. FIG. 4(b) is a section view along the line C—C' near the end 115, and FIG. 4(c) is a section view along the line D—D' in another region 116 inclusive of another end, and wherein $\alpha$ and $\beta$ indicate the directions in which the laser beam is emitted. In FIGS. 4(b) and 4(c), an n-type $Ga_{1-x}Al_xAs$ cladding layer 118 (x=0.45; Se-doped; n=$5 \times 10^{17}$ cm$^{-3}$; thickness=2 $\mu$m), a $Ga_{1-y}Al_yAs$ layer 119 (y=0.14, thickness=0.06 to 0.09 $\mu$m), and a p-type $Ga_{1-x}Al_xAs$ cladding layer 120 (Zn=doped; p=$3 \times 10^{17}$ cm$^{-3}$; thickness=2 $\mu$m) are continuously grown by the MOCVD method on an n-type GaAs substrate 117 (Si-doped; n=$1 \times 10^{18}$ cm$^{-3}$). Then, stripe-like window regions having a width of 20 to 100 um are formed maintaining a pitch of 300 $\mu$m in the $<0\bar{1}1>$ direction through a photolithography step, and the window portions are etched by about 0.25 $\mu$m with a chemical etchant. Thereafter, trapezoidal stripes are formed in the $<01\bar{1}>$ direction through the steps of photolithography and etching. In this case, the etching depth is about 1.5 $\mu$m, and the width of the upper surface of trapezpoid is 1 to 2 $\mu$m. Then, the trapezoidally striped portion of wafer is buried under an n-type GaAs layer 121 (Te-doped; n=$1 \times 10^{18}$ cm$^{-3}$) by the MOCVD method. Moreover, zinc is selectively diffused into the trapezoidally striped portion to form a current path 122. After the p-type electrode 123 and the n-type electrode 124 are formed, a semiconductor laser having a resonating wavelength of 300 $\mu$m is prepared through the steps of cleaving and scribing. Here, the cleaving is positioned in the region of etching window formed in the $<0\bar{1}1>$ direction in the aforementioned step.

The semiconductor laser produced by the above method operates at an oscillating wavelength of 780 nm with a threshold current of 50 mA. As for the lasing noise and astigmatism, the results are the same as those of the embodiment 1.

Embodiment 4

Figure 5:
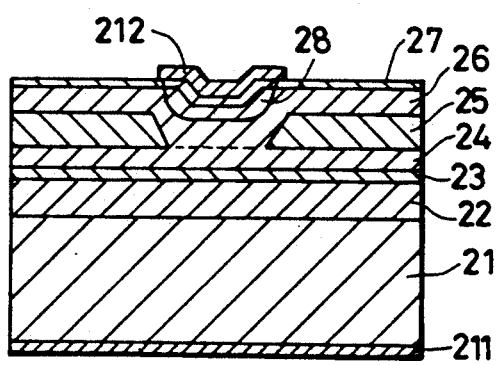
FIG. 5 is a section view showing the facet of a semiconductor laser according to an embodiment of the present invention.
Figure 6:
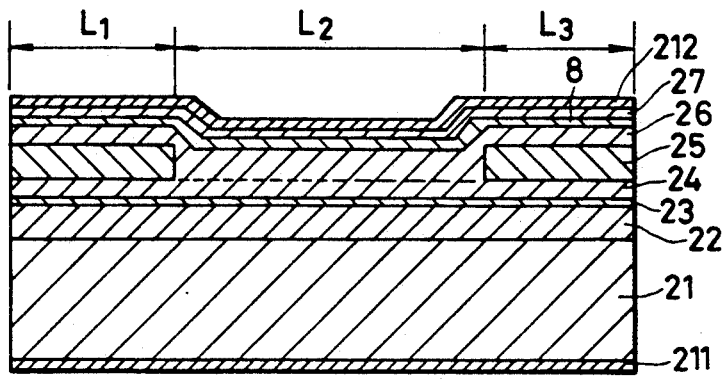
FIG. 6 is a section view showing the side surface of the laser.

FIG. 5 is a diagram which schematically shows the structure of a semiconductor laser of the present invention as viewed from the side of a facet that meets the laser beam at right angles. FIG. 6 is a section view of a plane in parallel with the direction in which the laser beam travels. The laser of this embodiment is produced through the steps mentioned below. Namely, on an n-type GaAs substrate 21 are formed an n-type $Ga_{0.55}Al_{0.45}As$ As layer 22 (Se-doped; n=$5 \times 10^{17}$ cm$^{-3}$; thickness=2 $\mu$m), an undoped $Ga_{0.86}Al_{0.14}As$ active layer 23, a p-type $Ga_{0.45}Al_{0.45}As$ cladding layer 24 (Zn-doped; p=$3 \times 10^{17}$ cm$^{-3}$; thickness= 0.2 to 0.6 $\mu$m), and an n-type GaAs layer 25 (Se-doped; n=$1 \times 10^{18}$ cm$^{-3}$; thickness=1 $\mu$m) by the well-known metal organic chemical vapor deposition (MOCVD) method. Then, windows for etching are formed in a photoresist film on the surface of the epitaxial layer through the step of photolithography. Windows are formed having a width of 2 to 7 $\mu$m maintaining a pitch of 400 $\mu$m in a direction at right angles with the laser resonator, and having a width of 50 to 260 $\mu$m maintaining a pitch of 300 $\mu$m in the direction of the laser resonator. Then, grooves are so formed as to reach the p-type $Ga_{0.55}Al_{0.45}As$ layer by chemical etching. The photoresist film is then removed, and a p-type $Ga_{0.55}Al_{0.45}As$ layer 26 (Zn-doped; p=$3 \times 10^{18}$ cm$^{-3}$; thickness=1 $\mu$m) and an n-type GaAs layer 27 (Te-doped; n=$10^{18}$ cm$^{-3}$; thickness=0.5 $\mu$m) are formed by the MOCVD method. Thereafter, using the technique of selective diffusion, a stripe-like selectively Zn-diffused region 28 is formed having a width of 2 to 5 $\mu$m. After a p-type and n-type electrodes 12, 11 are formed, a chip having a width of 400 $\mu$m and a resonator length of 300 $\mu$m is prepared through the step of cleaving. The thus prepared element has a structure as schematically shown in FIG. 6 without n-type GaAs layer 25 at the central portion of the resonator.

The thus prepared element is bonded to a stem using a PbSn solder with the p-type electrode on the lower side, and is continuously operated at room temperature to evaluate the characteristics. The element oscillates at a wavelength of 780 nm with a threshold current of 30 to 50 mA, and exhibits stable lateral fundamental mode operation up to an optical output of 30 mW. The element temperature is changed from 0° C. to 60° C., and the feedback intensity of light is changed to measure the RIN (relative intensity of noise). An element without the n-GaAs layer 25 in which the region of a length $L_2$ occupies 5 to 90% of the total resonator length $L_1+L_2+L_3$ of the element, exhibits an RIN value of $3 \times 10^{-14}$ $H_z^{-1}$ at the greatest when the feedback intensity of light ranges from 0.1 to 2%. When the region of the length $L_2$ occupies less than 5% or more than 9% of the total resonator length, on the other hand, the RIN value further increases. The astigmatism was measured for those elements in which the region of the length $L_2$ occupied 5 to 90% of the total resonator length, and it was found that the beam waist position in a direction in parallel with the junction was within 5 $\mu$m from the facet.

Embodiment 5

Figure 7:
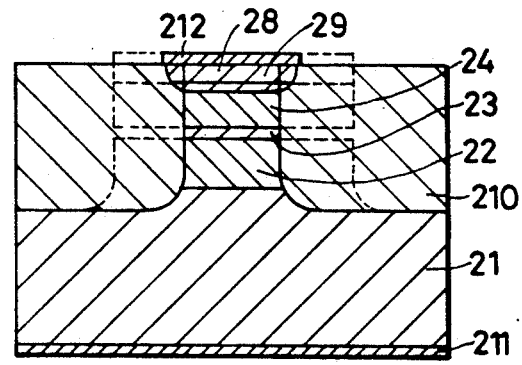
FIGS. 7 and 8 are section views showing the facet and side surface of the laser according to an embodiment 5 of the present invention.
Figure 8:
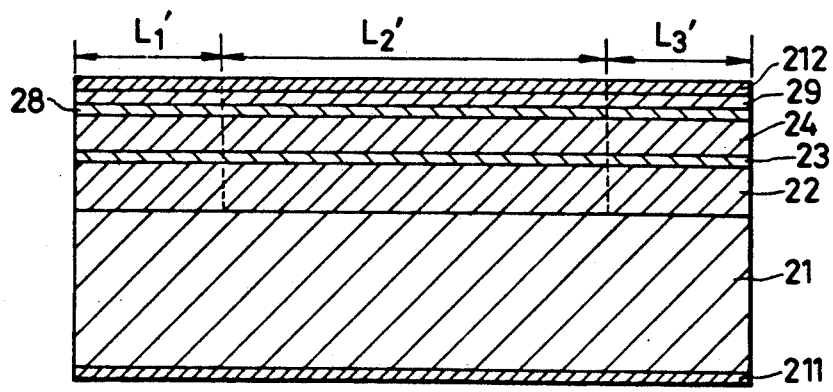

FIG. 7 is a section view on a plane which intersects, at right angles, the direction in which the laser beam travels, and FIG. 8 is a section view on a plane which is in parallel with the direction in which the laser beam travels. The laser of this embodiment is produced through the steps described below. A double heterostructure is formed in an n-type GaAs substrate 21 by the liquid-phase growing method and, then, a mesa is formed through a step of photolithography. In this case, as schematically shown in FIGS. 7 and 8 which are diagrams as seen from the side of a facet and from the side surface, the mesa width is narrowed (1 to 3 μm in width) toward the facet and is broadened (5 to 400 μm) in the central portion of the resonator. In FIG. 7, solid lines indicate a narrow region and dotted lines indicate a broad region. An n-type $Ga_{0.8}Al_{0.2}As$ layer 29 is formed as a cap layer. Then, the mesa is buried under the $Ga_{0.55}Al_{0.45}As$ layer 210 of a high resistivity formed by the liquid-phase growing method. After the electrodes 211, 212 are formed, the element having a resonator length of 300 μm is obtained through the step of cleaving.

The laser continuously oscillates at room temperature with a threshold current of 10 to 30 mA, and exhibits a stable lateral fundamental mode operation over an optical output range of 5 to 20 mW. The element was measured for its noise characteristics, and the same effects were confirmed as those of the embodiment 4. That is, when the region $L_2'$ where the mesa has a broad width occupied 5 to 90% with respect to the regions $L_1'$ and $L_3'$ where the mesa has a narrow width, the RIN value is $3 \times 10^{-14}$ $Hz^{-1}$ at the greatest. When the region $L_2'$ occupies less than 5% or more than 90%, on the other hand, the RIN value further increases.

The above embodiments have referred to the cases where the index-guiding structure is provided near the facets on both sides of the laser. However, the same results are also obtained even when the index-guiding region is provided near the facet on one side only of the laser to occupy 5 to 90% of the total length.

Further, although the above-mentioned embodiments have dealt with semiconductor lasers of the type of GaAs-GaAlAs, it need not be pointed out that the present invention is further extensively applicable to semiconductor lasers using compound semiconductors of the type of InP-GaInAsP and the like.

Embodiment 6

Figure 9:
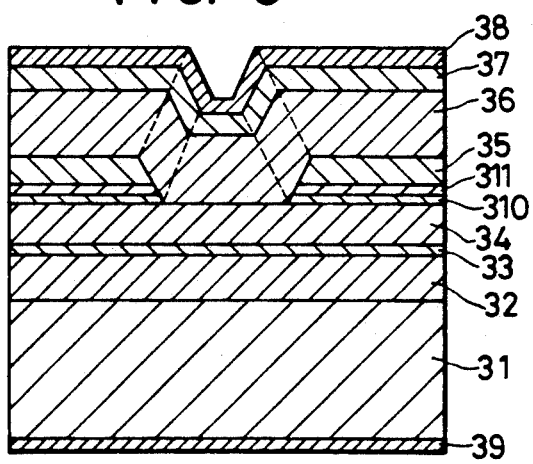
FIG. 9 is a section view showing the structure of an embodiment 6 of the present invention.

An embodiment 6 of the invention will be described below in detail in conjunction with FIG. 9.

On an n-type GaAs crystalline substrate 31 are successively formed an n-type $Ga_{1-x}Al_xAs$ cladding layer 32 (x=0.45), a $Ga_{1-y}Al_yAs$ active layer 33 (y=0.14), a p-type $Ga_{1-x}Al_xAs$ cladding layer 34 (x=0.45), an n-type $Ga_{1-z}Al_zAs$ supersaturated absorbing layer 310, an n-type $Ga_{1-u}Al_uAs$ absorbed carrier leakage preventing layer 311, and an n-type GaAs injection current confinement layer 35 by the MOCVD method. The n-type GaAs layer 35, n-type $Ga_{1-u}Al_uAs$ absorbed carrier leakage preventing layer 311, and n-type $Ga_{1-z}Al_zAs$ supersaturated absorbing layer 310 are completely removed by the step of photoetching at specific locations, and a grooved stripe of a width of 1 to 15 μm is formed to expose the surface of the p-type $Ga_{1-x}Al_xAs$ cladding layer 34. Then, a p-type $Ga_{1-x}Al_xAs$ cladding layer 36 (x=0.45) and a p-type GaAs cap layer 37 are formed by the MOCVD method. After a p-type electrode 38 and an n-type electrode 39 are formed, a laser element having a resonator length of about 300 μm is obtained by the method of cleaving. If the thickness $d_1$ of the active layer and the thickness $d_2$ of the p-type cladding layer 34 are increased, the laser element approaches the narrow stripe construction and assumes a multi-mode type oscillation. If the thickness are reduced, the laser element assumes a single-mode type oscillation. Relations 0.03 μm$<d_1<$0.12 μm and 0.3 μm$<d_2<$1.2 μm establish a condition for eliminating the astigmatism. Under the condition of no astigmatism, furthermore, the requirement for generating self-pulsation is established by 0.05$<Z<$0.14, 0.15$<u<$0.6, by the thickness $d_3$ of the supersaturated absorbing layer 310 which lies 1 nm$<d_3<$0.2 μm, and the thickness $d_4$ of the absorbed carrier leakage preventing layer 311 which lies 1 nm$<d_4<$0.2 μm.

The thus prepared laser element continuously oscillates at room temperature at a wavelength of 780 nm with a threshold current of 30 to 50 mA, and the oscillating spectrum exhibits a self-pulsating spectrum. Further, the relative intensity of noise (RIN) is as small as $3 \times 10^{-14}$ $Hz^{-1}$ (with the light being fed back). The astigmatism is smaller than a measurable limit (1 μm). Even after the laser element is operated for 2000 hours producing an optical output of 10 mW constant maintained at 70° C., performance of the element is not deteriorated, manifesting high reliability.

Though this embodiment employs a single GaAlAs layer as an active layer, the same results are also obtained even with the MQW (multi-quantum well) structure or the GRIN (graded refractive index) structure in which the active layer is formed by the superlattices of GaAs and $Ga_{1-x}Al_xAs$. Further, it need not be pointed out that the element of this embodiment can also be adapted to other material systems such as of InGaAsP, InGaP, InGaAlP, and the like.

What is claimed is:

1. A semiconductor laser comprising at least a second semiconductor layer of a first type of conductivity, a third semiconductor layer having a larger refractive index than that of the second semiconductor layer and a smaller forbidden band width than that of said second semiconductor layer, a fourth semiconductor layer of a second type of conductivity having a smaller refractive index than that of said third semiconductor layer and a larger forbidden band width than that of said third semiconductor layer, a fifth semiconductor layer of the first type of conductivity having a smaller forbidden band width than that of said third semiconductor layer, a sixth semiconductor layer of the first type of conductivity having a larger forbidden band width than that of said fifth semiconductor layer, and a seventh semiconductor layer of the first type of conductivity having a smaller forbidden band width than the respective bandwidths of said third, fifth and sixth semiconductor layers, that are successively formed on a first semiconductor region of the first type of conductivity, wherein said fifth, sixth and seventh semiconductor layers are removed in the form of a stripe by etching, and an eighth semiconductor layer of the second type of conductivity is formed on the surfaces that are removed by said etching and on the surface of said seventh semiconductor layer, said eighth semiconductor layer having a smaller refractive index than at least that of said third semiconductor layer and a larger forbidden band width than at least that of said third semiconductor layer.

2. A semiconductor laser according to claim 1, wherein said fifth semiconductor layer has a film thickness of 1 nm to 0.2 μm, said sixth semiconductor layer has a film thickness of 1 nm to 0.2 μm, and the layers are removed in the form of a stripe by said etching over a width of 1 to 15 μm.

3. A semiconductor laser comprising at least a second semiconductor layer of a first type of conductivity, a third semiconductor layer having a larger refractive index than that of the second semiconductor layer and a smaller forbidden band width than that of said second semiconductor layer, a fourth semiconductor layer of a second type of conductivity having a smaller refractive index than that of said third semiconductor layer and a larger forbidden band width than that of said third semiconductor layer, a fifth semiconductor layer having a smaller forbidden band width than that of said third semiconductor layer, a sixth semiconductor layer of the first type of conductivity having a larger forbidden band width than that of said fifth semiconductor layer, and a seventh semiconductor layer of the first type of conductivity having a smaller forbidden band width than the respective bandwidths of said third, fifth and sixth semiconductor layers, that are successively formed on a first semiconductor region of the first type of conductivity, wherein said fifth, sixth and seventh semiconductor layers are removed in the form of a stripe by etching, and an eighth semiconductor layer of the second type of conductivity is formed on the surfaces that are removed by said etching and on the surface of said seventh semiconductor layer, said eighth semiconductor layer having a smaller refractive index than at least that of said third semiconductor layer and a larger forbidden band width than at least that of said third semiconductor layer.

* * * * *